US005685505A

United States Patent [19]
Meckler

[11] Patent Number: 5,685,505
[45] Date of Patent: Nov. 11, 1997

[54] WAVE ENERGY BEAMING AND HOLOGRAPH TRACKING FOR POWER GENERATING SPACECRAFT PLATFORMS

[76] Inventor: Milton Meckler, 930 20th St., Apt. 2, Santa Monica, Calif. 90403

[21] Appl. No.: 375,385

[22] Filed: Jan. 17, 1995

[51] Int. Cl.$^6$ ............................................. F03H 5/00
[52] U.S. Cl. ............................. 244/169; 266/158 R
[58] Field of Search ............................ 244/169, 173, 244/158 R, 172

[56] References Cited

U.S. PATENT DOCUMENTS

| | | | |
|---|---|---|---|
| 3,564,253 | 2/1971 | Buckingham | 244/158 |
| 3,818,700 | 6/1974 | Kantrowitz et al. | 244/172 |
| 3,825,211 | 7/1974 | Minovitch | 244/172 |
| 3,933,323 | 1/1976 | Dudley et al. | 244/158 |
| 4,368,415 | 1/1983 | Henderson et al. | 244/173 |

Primary Examiner—Andres Kashnikow
Assistant Examiner—Tian Dinh
Attorney, Agent, or Firm—William H. Maxwell

[57] ABSTRACT

A wave energy receiving platform installed to track in alignment within a look angle of the sun or a wave energy beaming platform, using holographic windows recorded according to time related positions of the platforms as zone plates to concentrate the wave energy in energy converters, and to columnate light for energy beaming, one embodiment utilizing a circular holographic window for "spot" insolation and a dish-shaped reflector for photovoltaic power assimilation and microwave transmission, a second embodiment utilizing a rectilinear-shaped holographic window for "bar"-shaped beaming and an elongated reflector for photovoltaic power assimilation and microwave transmission, a rectilinear Stirling cycle engine directly operating a rectilinear alternator for generating electrical power, the photovoltaic power synchronized therewith for in-house operation and primary propulsion.

6 Claims, 9 Drawing Sheets

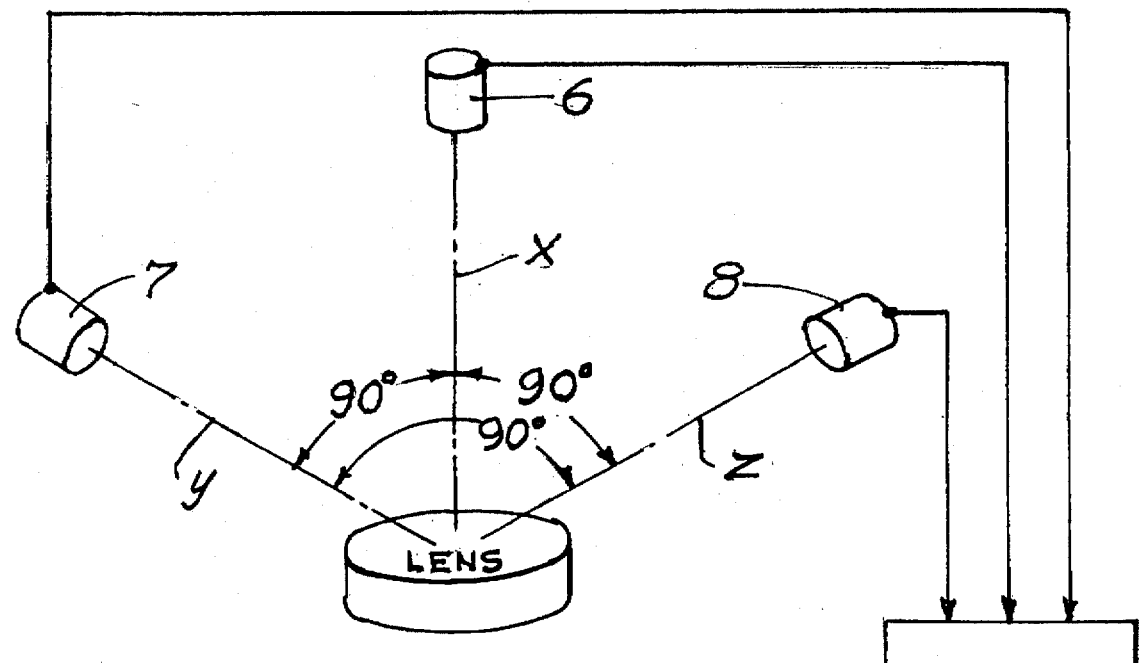
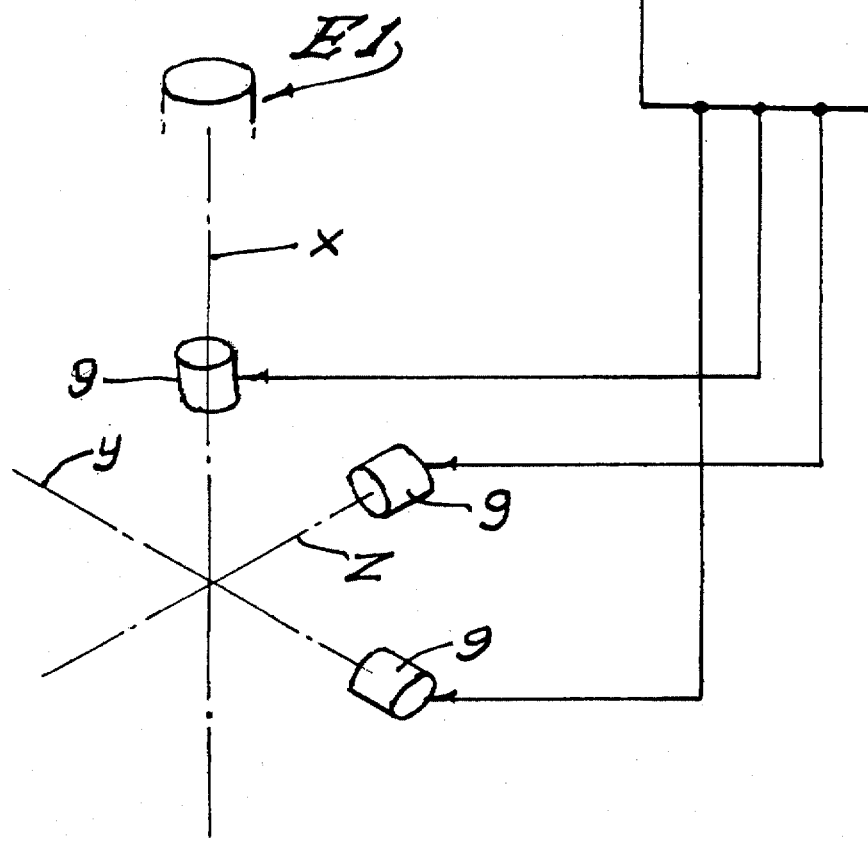
FIG. 5.

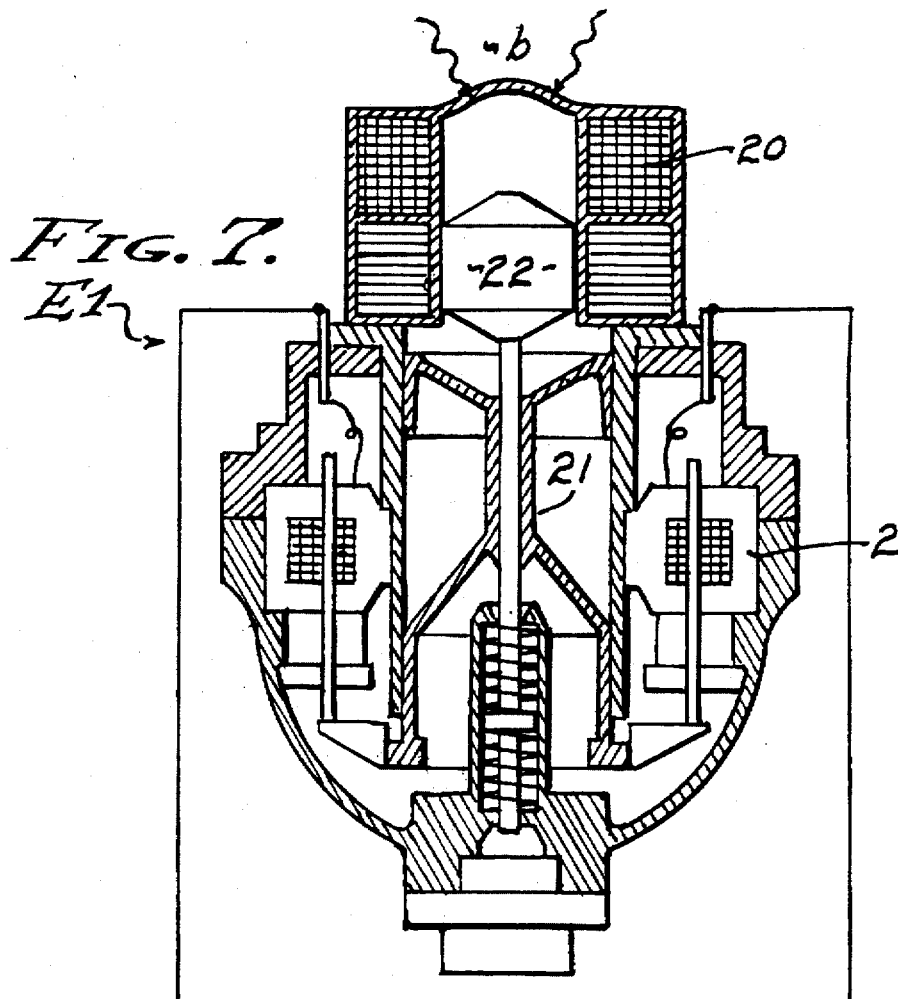
FIG. 7.
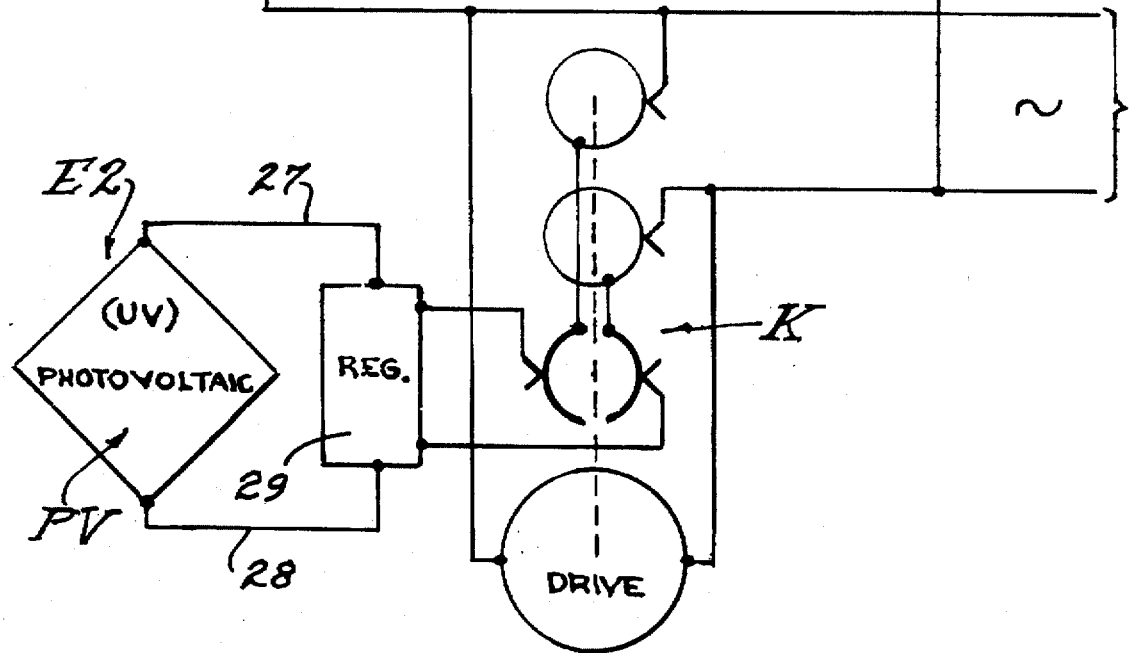

5,685,505

WAVE ENERGY BEAMING AND HOLOGRAPH TRACKING FOR POWER GENERATING SPACECRAFT PLATFORMS

BACKGROUND OF THE INVENTION

A fundamental requirement for satellite and space vehicle operation is the provision of continuous electrical power. The methods used to supply power have been dominated by photovoltaic cells, radioisotope generators, fuel cells and batteries, and all of which constitute a great part of the satellite and/or vehicle weight. Another fundamental requirement is propulsion and positioning thrusters for launching and acceleration into an orbit or trajectory, and to correct and to maintain a designated position or condition in space. Power failure has been a prevalent factor in the life and demise of satellite and spacecraft, and a basic limiting factor of their life expectancy. These considerations are based upon the fact that satellites and spacecraft have been implemented with on-board power systems in order to be self sufficient, it being a general object of this invention to substantially eliminate on-board power systems as such, by transmitting power to the satellite or spacecraft from a remote power source. Accordingly, the mass of the satellite or spacecraft is greatly reduced with a commensurate reduction in launch and acceleration requirements and with the advantage of power supply service and repair and/or substitution or replacement of an earthbound installation.

This invention involves the transmission of wave energy to a platform in space, from a remote earth based or another space based platform source of said energy. Accordingly, it is an object of this invention to beam wave energy from a remote energy source platform to a power generating platform in space. The energy receiving platform may be installed on a launch vehicle or on a satellite in earth orbit, geosynchronous orbit, or beyond, and the energy transmitting platform may be installed on orbiting or traveling spacecraft in space. The transmission distance will vary as will the wave length and frequency, there being two wave energy systems that are presently feasible, 1) radio microwave systems, and 2) optical laser systems. The latter is preferred for its transmission efficiency and capability of direct conversion by energy conversion receivers on the spacecraft platform. Photovoltaic receivers are used alternately for solar power generation and for power beaming generation. A feature of this invention is the employment of power beaming electrical generation at the spacecraft platform, and particularly during solar eclipse periods in orbit.

This invention employs an energy transmitting laser system utilizing lenses or mirrors of sufficient size to minimize beam spread due to diffraction, it being an object to compensate for atmospheric turbulence at the receiving power generating platform. Accordingly, I employ my holoconcentrator concept as it is disclosed in my U.S. Pat. No. 4,490,981 issued Jan. 1, 1985, in which recorded holograms track the wave energy source. As disclosed herein, the energy source platform is fixed onto or tracks the spacecraft power generating platform, where holographic means compensates for irregular beam projection and replaces and/or augments mechanical tracking back to the energy source platform.

A primary object of this invention is to convert wave energy into electrical power at the spacecraft platform. State of the art laser systems are employed at the transmitting power beaming station or platform, in order to beam wave energy to an orbiting or traveling spacecraft. In combination with and/or in place of the aforesaid photovoltaic receiver, this invention provides wave energy conversion means in the form of a heat engine and preferably a Stirling cycle engine that directly drives an electrical generator. In practice, this is a rectilinear engine and alternator, as will be described.

An object of this invention is to track a positioned power source platform from an orbiting power generating platform, for the reception of wave energy beamed from the positioned power source platform and converted into electrical power at the orbiting power generating platform. In practice, the wave energy source is a light wave projecting laser having a predetermined planet, earthbound or orbit bound position. In other words, the power source platform can be a terrestrial, extraterrestrial or orbital spacecraft installation; its position being known. And, the wave energy is transmitted by beaming optics that tracks the power generating platform in space and focuses a spot of light wave energy on the receiving spacecraft's insolation system. The laser light is adversely affected by diffraction, but not so greatly as to defeat the purpose of power beaming, atmospheric turbulence being the detrimental factor. Therefore, it is an object to position the power source platform at a high altitude so as to avoid penetrating the earth's atmosphere; ie. on mountain peaks or on orbiting platforms.

Another object of this invention is to holographically track the power source platform from the relatively moving orbiting spacecraft. That is, the power generating platform at the orbiting spacecraft as herein disclosed provides an insolation tracking receiver installed in alignment with the power source platform's position and within a predetermined look angle of holographic windows recorded according to time and related to the spacecraft's position, to concentrate wave energy into a preferred Stirling cycle power generating receiver. Accordingly, a low orbiting spacecraft tracks the aforesaid projected spot of the laser power beam within a predetermined look angle. In practice, one or more power beaming platforms are positioned to power beam wave energy during the eclipse period affecting the orbiting power generating platform; or continuous power beaming is provided by deploying a series of strategically positioned power source platforms, for example circumferentially around the earth.

SUMMARY OF THE INVENTION

This invention is a further development of my FIXED SOLAR CONCENTRATOR SATELLITE RECEIVER AND CO-GENERATOR, subject of U.S. Pat. No. 4,490,981 issued Jan. 1, 1985, wherein a planar window accommodating a multiplicity of zone plate means is disclosed in combination with a heat absorbing generator means, and directed broadly to microwave feed means, to process wave energy. A holoconcentrator concept is employed, which avoids the problems of reflective losses etc. while providing combined variable image focusing and optical diffraction correction and tracking capabilities as well. The general object of this invention is to utilize energy beaming transmission of power and energy conversion by means of Stirling, Rankine or Brayton cycle heat engines and direct rectilinear electrical generation. Stirling cycle is preferred, providing high power efficiency.

The wattage demands of space stations, and of in-transit and in-orbit space vehicles for burst demand is in the hundreds of KW to MW of power; this is for electric propulsion and for corrective thrust application. The demand is followed by a continued demand of tens of KW to MW of power for "house keeping" and battery charging etc. And, these requirements must be adaptable to low earth as well as geosynchronous orbit.

The power beaming and electric generation system herein described is inherently capable of energy wave transmission and reception. Whether in-transit, in low orbit or synchronous orbit, the beaming between parabolic optical surfaces, with or without supporting substrates, transmits and receives wave energy.

A general object of this invention is to reduce initial launch weight requirements, with a commensurate launch cost reduction, by reducing the need for a charged battery, or batteries at all, while the power platform of the satellite is in solar eclipse, or other such condition. That is, by beaming power from a remote earthbound energy source transmitting platform, and by providing an energy receiving platform at the satellite, it is then possible to greatly reduce the gross weight at launch, whereby economics of an entire space program is enhanced.

The power platform in space can be substantially devoid of a battery burden. The tremendous weight of batteries can now be replaced with a useful load. The solar energy collection systems can be substituted for without reliance upon battery power supplies for deployment during an eclipse period.

The wave energy transmitted and received is within the range of solar through microwave and laser beaming, and any other theoretical energy wave that may be conceived. It is the holographic concentrator for wave energy beaming with which this inventive concept is particularly concerned, to transmit and receive energy at low orbit and geosynchronous orbit spacecraft from known position platforms.

This inventive concept provides an energy wave beaming platform and an energy wave receiving platform. The transmitting platform is fixed onto and made to track the receiver platform. The receiver platform is the power generating station that converts wave energy into electrical power, and which tracks the power beaming platform by means of holographics comprised of recorded windows relating the positions of the distant platforms, as zone plates concentrating energy waves that are then processed by the preferred Stirling cycle and direct alternator, producing current that is synchonized with the spacecraft power system by commutation.

This inventive concept provides electrical power for spacecraft launch systems, whereby electric thrusters are employed after initial launch. Accordingly, the spacecraft launch vehicle is provided with a high power generating platform to which wave energy is beamed during the acceleration phase of placing the spacecraft into orbit. One of several types of thrusters are employed, characterized by means for accelerating a propellent, as will be described. It is to be understood that the launch thrusters will be energized electrically during the launch phase, and that positioning thrusters of lesser thrust will continue with the spacecraft platform to enable repositioning of the spacecraft in orbit or on a trajectory through outer space.

This inventive concept also provides for ground control command via the wave energy beam directed from the power source platform to the power generating (converting) platform. A feature is the use of the power beam as a carrier wave upon which a command signal is superimposed. Accordingly, the power source beaming of wave energy serves a dual purpose enabling ground control of the spacecraft, as well as power enablement for general operation and propulsion.

HOLOGRAPHY: Holography is a method by which the wave field of light is recorded as an interference pattern, sometimes called a lensless system since the usual lens required in optics is replaced by a film having zone plates that diffract and thereby focus the light. The process of interference is involved wherein wave length and phase establish "constructive interference" that increases amplitude, and "destructive interference" that decreases amplitude. The interference effect normally requires that the light be coherent: coherent light being monochromatic (having a single wave length) that maintains the form of its phase front. That is, successive wave fronts, as they pass a given location, all have the same shape. Therefore, laser light is a most appropriate source of coherent light, to be used in producing and/or utilizing holograms and transmitting wave energy for the purposes herein disclosed. The technique of "off-axis holography", produced with a reference beam of light introduced obliquely with respect to the subject beam of light, enables the straight-through or unaffected light to be separated, since the various waves travel in different directions.

The significant holographic feature employed herein is the "volume hologram" in which the thickness of the film or recording medium accommodates a multiplicity of "zone plates" in the form of interference patterns embedded within the thickness of the film or recording medium and each passing a discrete frequency of light. Diffraction from volume holograms is orientation sensitive whereby many sets of wave patterns can be recorded in a single volume hologram, each with the recording material having a slightly different orientation. When the hologram is subject to the passage of light, only one set of waves at a time can have the proper orientation to produce a diffracted wave. When the light source is rotated slightly with respect to the plane of the film, the one diffracted wave is extinguished and another diffracted wave appears. Thus, the hologram exhibits wavelength selectivity. For light incident on the hologram at a given angle, the diffracted light is formed only for the light of proper wavelength, the wave length selectively being greatest when the subject and reference beams are introduced from opposite sides of the film, this type of hologram being known as the "white light hologram" because it diffracts white light from a source. This type of hologram selects only a narrow band of light out of the wide band of wave lengths that comprise white light, this narrow band of light being diffracted by the hologram. The remaining light passes through the hologram without diffraction. The volume recording medium can be a photographic emulsion of moderately great thickness, or a number of layers of light sensitive material that can be darkened by exposure to coherent light, for recording to establish interference patterns.

Diffraction is an important phenomenon in holography, a grating employed at the zone plates whereby light is deflected, and herein to have a variable lens function. Accordingly, different gratings of zone plates are established by laser photography or the like, whereby permanent holograms are established in one or more zone plates as multiple slit gratings. In the photographic recording of holograms, the change from transparent to opaque areas is gradual rather than sudden, and this causes the light amplitude to vary gradually. This sinuous variation in light amplitude has its advantageous effect in diffraction analogous to refraction in a solid transparent lens or the like. In holography the light passes around opaque objects (diffraction) rather than through a substance (refraction), but nevertheless the direction of certain light waves is altered. In holography, the interference pattern generated by sets of light waves is three dimensional in extent, and when such a pattern is recorded as by photography, it does not merely exist at the surface of an emulsion or film, but establishes itself in plates throughout the volume or thickness of said emulsion or film. Therefore, photographically produced gratings or zone plates of holograms are considered as recorded wave interference patterns through which multi-color light behaves according to wavelength. A zone plate can be described as a set of flat, parallel lines or concentric annular rings which diffract light waves so that they are columnated or so that they add constructively at a desired focal point, preventing the passage of light waves that would interfere destructively at that point. The emulsion of a photographic plate or film may be many, perhaps twenty or more, light wavelengths in thickness, so that three dimensional patterns can be established as distinctively effective zone plates.

It is an object of this invention to achieve the insolation of wave energy through the use of a diffraction panel or panels in combination with a reflector dish which serves as a wave energy receiver or transmitter. Heretofore, solar panels have been fixed to face skyward toward the suns traverse, and have been focused at the sun throughout its traverse by means of tracking devices. This invention provides for the alternate tracking of the sun as a wave energy source or a platform as a wave energy source, and employs holography for insolation of said wave energy sources, alternately as said wave energy is made available This invention is characterized by a tracking collector and concentrator with holograms that have diffraction capability inherent in a hologrpahic window to direct wave energy along the collector axis. Holography involves interference patterns between two or more sets to light waves, and by which films or laminates are formed with certain gratings that will selectively function as lenses that focus certain wavelengths of light. Accordingly, films with distinctive gratings will have varied and predetermined focusing characteristics, established photographically as zone plates and each adapted to redirect and focus light waves of a certain wavelength. The angle of redirection or diffraction can be great, so that sunlight at a low angle of incidence can be redirected as light moves through the hologram grating which then focuses those waves by means of diffraction, similar to lens refraction, to emanate substantially normal therefrom or within a prescribed angle thereto. In practice, a multiplicity of hologram zone plates are established in layers and together establish distinctive grating zones acting together to focus sunlight with diminishing effect from a low angle of incidence to a high angle of incidence or to the Zenith, and so that light wave transmission through the holographic laminate emanates substantially normal therefrom at all times of day between shortly after sunrise and shortly before sunset. This primary diffraction of the incoming sunlight (or beamed laser light as will be described) will be referred to herein as "normalizing" the light, a redirecting of incoming white light into selected wavelength light projected in an alignment substantially parallel to the axis of the collector. The holograms are preferably planar as shown herein, as distinguished from the reflector dish for microwave transmission.

Sunlight and beamed laser light is received as white light that passes selectively through holographic laminates or plates, the infrared (IR) wave portion of the spectrum being separated for heat absorption, and the ultraviolet (UV) portion of the spectrum being separated for photovoltaic power operation. It is an object of this invention to receive white light and to separate it into distinct wavelength ranges while normalizing its projection to occur parallel with the axis of the collector. In accordance with this invention, spectrally selective holograms comprised of circularly concentric gratings are provided to separate the infrared portion of the spectrum from the ultraviolet portion of the spectrum while normalizing the same along the collector axis. In practice, the infrared portion is concentrated and the ultraviolet portion is columnated, there being hologram gratings for infrared light diffraction and hologram gratings for ultraviolet light diffraction The range of wavelength diffraction can be established within practical limits as circumstances require.

It is another object of this invention to project the normalized incoming light separately as infrared and ultraviolet light into a heat absorption receiver of a power generator and onto a photovoltaic power generator, respectively. Accordingly, there is a first spectrally focusing hologram comprised of circular gratings having a focal plane for concentrating infrared heat rays, and there is a second columnating hologram that projects said ultraviolet light onto a photovoltaic power generator plane at or surrounding the said concentration of infrared light. A feature of this invention is that the infrared light diffracted by an overlying hologram unaffectedly passes through an underlying hologram that separately diffracts ultraviolet light, or vice versa, the one light passing unaffectedly through the overlying hologram to be diffracted by the underlying hologram. Diffracted light in both instances is normalized and projected along or parallel to the collector axis. It is an object of this invention to advantageously employ a Stirling cycle power generator, or the like, at said focal plane of infrared light, and to advantageously employ photovoltaic cells at said plane thereof surrounding said power generator. It is also an object of this invention to superimpose photovoltaic cells upon a substrate in the form of a micro wave energy reflector, the holograms and photovoltaic cells having little or no adverse effect upon microwave energy reception.

It is still another object of this invention to combine dual purpose laser-solar collector (UV) and concentrator (IR) with a microwave dish that simultaneously serves in combination with a heat engine, either Rankine or Brayton cycle. A feature of this invention is that microwaves penetrate the hologram plates without being adversely affected, and also penetrate the lattice of the photovoltaic cells. As shown, the substrate and structural support for the microwave dish is finned for heat radiation, and the microwave dish focuses onto a receiver assembly removed from the concentration of ultraviolet light.

It is a general object of this invention to provide for co-generation of electricity whereby Stirling cycle power and photovoltaic power are combined and commutated into a spacecraft power system. In practice, the Stirling cycle power generator is of the rectilinear type with a directly coupled alternator, and the photovoltaic power generation commutated therewith as synchronized alternating current, the combination of the two being synchronous. Alternatively, the generator current is converted to direct current by rectification or commutation, for combining with or substituting for the photovoltaic power. In accordance with this invention, the energy source platform is either earth or planet or geosynchronous based, it being advantageous to employ the latter, especially when cloud cover prevails to occlude transmission of light to the former, thereby ensuring efficient beaming of light (laser) energy to the spacecraft power generating platform.

The foregoing and various other objects and features of this invention will be apparent and fully understood from the following detailed description of the typical preferred from and applications thereof, throughout which description reference is made to the accompanying drawings.

THE DRAWINGS

FIG. 5 is a schematic view illustrating the principles of tracking on x, y and z axes using sensors and related servos on commensurate axes.

FIG. 6 is a schematic view of an electric powered thruster illustrating its principles of operation.

FIG. 7 is a schematic view of the co-generation performed by this invention by means of insolation of infrared wave energy using the preferred Stirling cycle to absorb the lower energy light, and by means of photovoltaic absorption to adsorb the higher energy light, and illustrating the co-generation relationship thereof.

Figure 11:
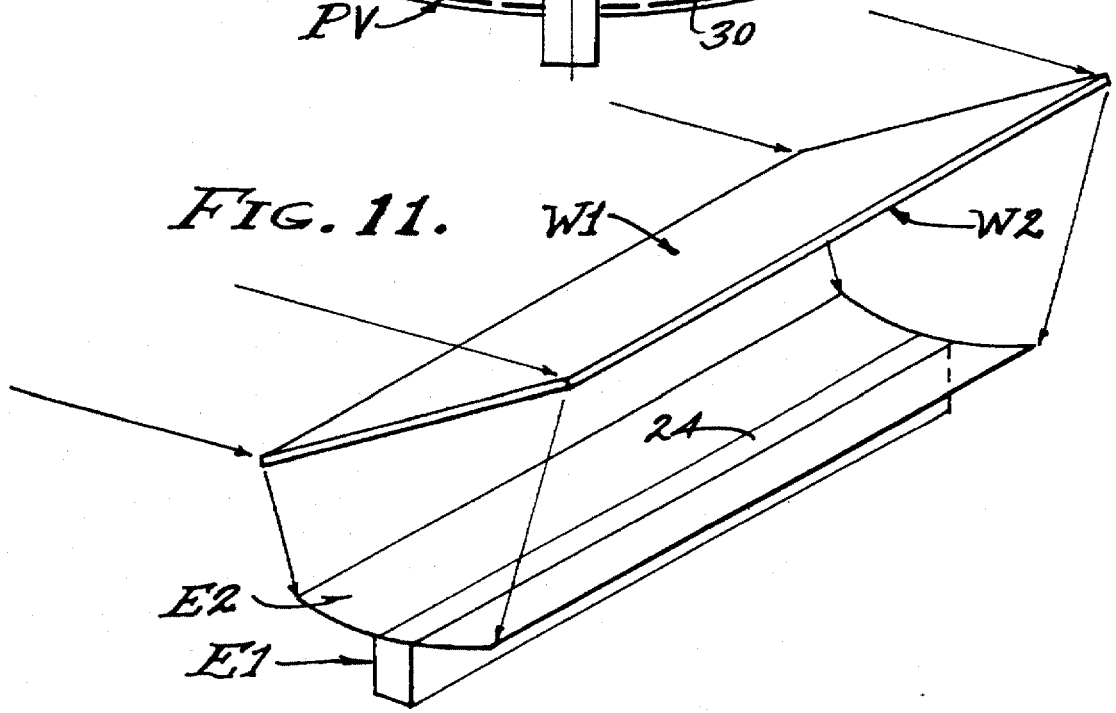

And, FIG. 11 is a perspective view of a rectilinear embodiment of the collector wherein the windows and collector elements are elongated so as to receive bar-shaped beams of light wave energy.

PREFERRED EMBODIMENT

Figure 1:
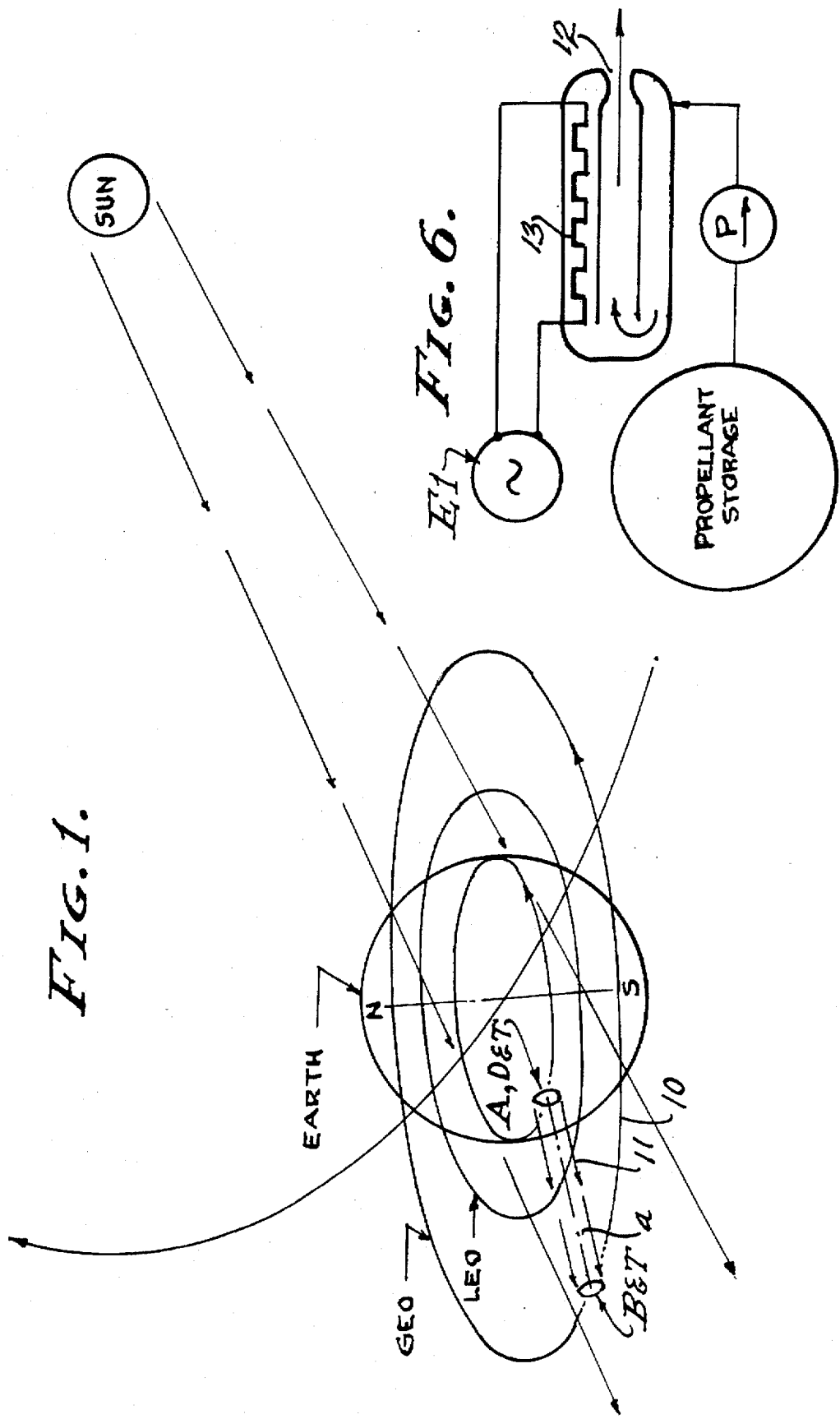
FIG. 1 is a perspective view of a basic form of the wave energy beaming and holograph tracking for power generation on spacecraft platforms, showing a power source platform beaming to a power generating platform in geosynchronous orbit.
Figure 2:
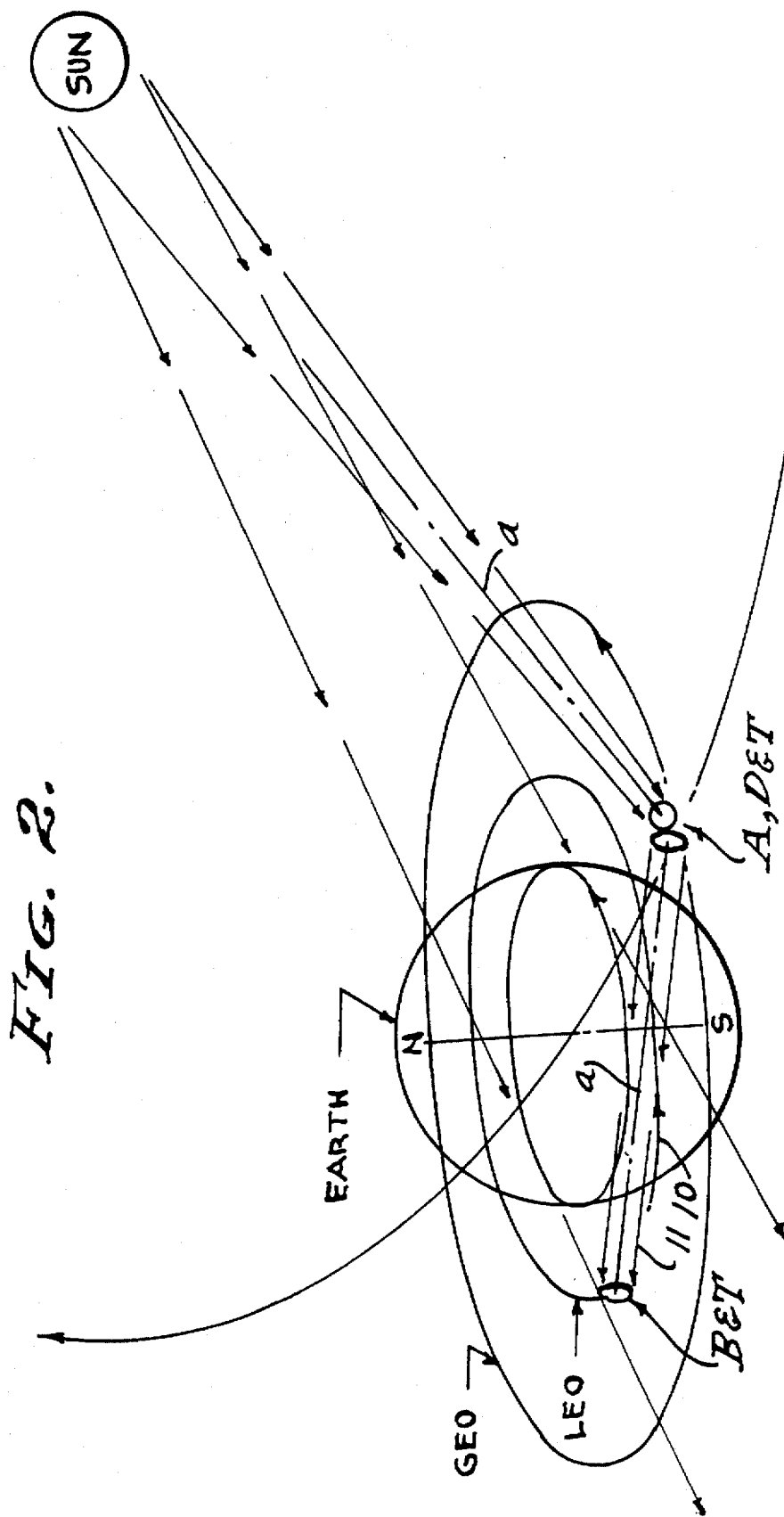
FIG. 2 is a view similar to FIG. 1 and of a solar powered spacecraft platform in low earth orbit receiving beamed wave energy from a spacecraft platform in geosynchronous earth orbit.
Figure 3:
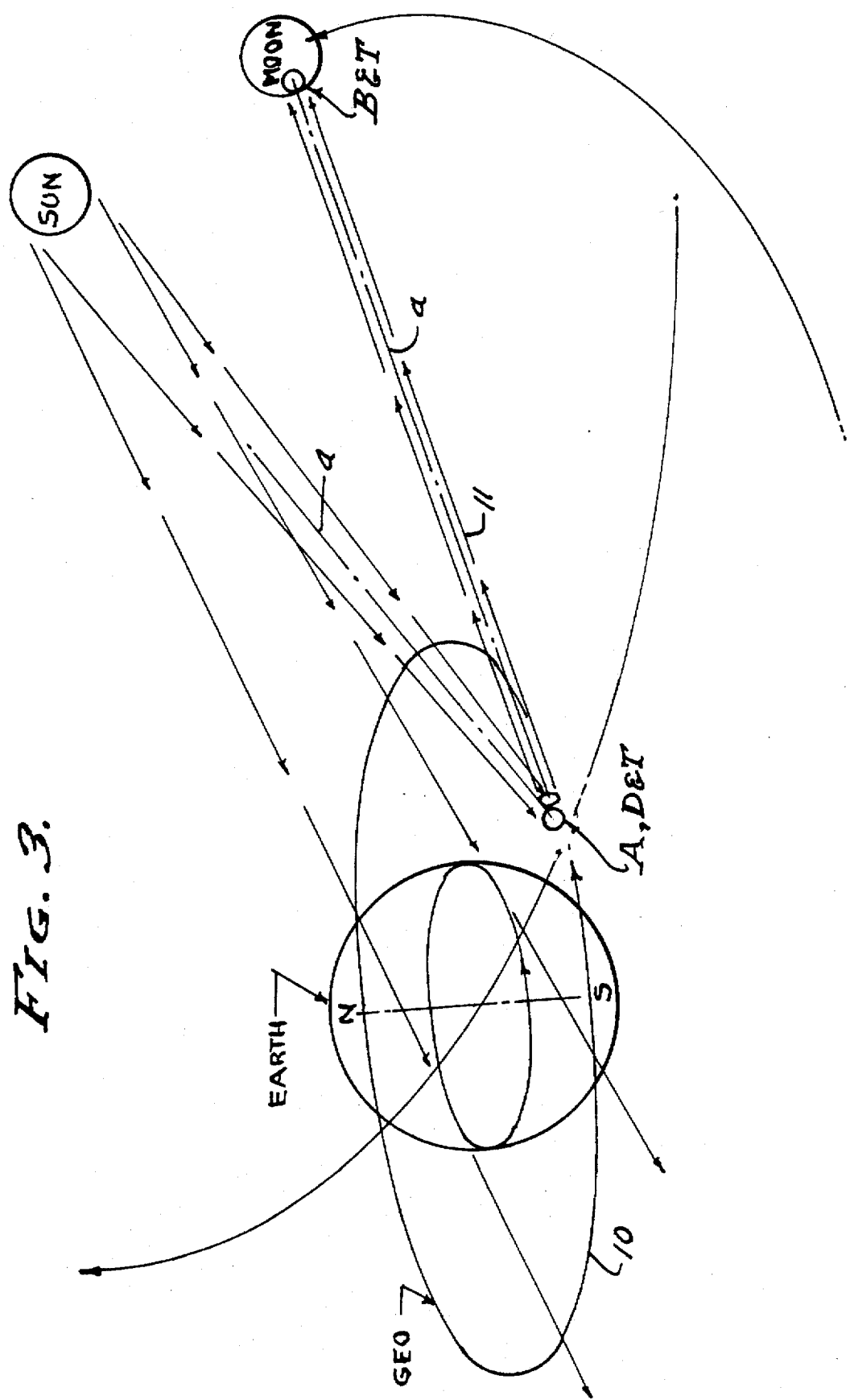
FIG. 3 is a view similar to FIG. 2 and of a solar powered platform on a planet, the Moon, in space.

Referring now to the drawings, FIGS. 1, 2 and 3 schematically illustrate wave energy beaming from an energy source platform A to a power generating platform B. The energy source platform may or may not be in orbit, being positioned in FIG. 1 as an earth based platform, whereas in FIGS. 2 and 3 the energy source platform A is positioned in orbit, for example in a Geosynchronous Earth Orbit (GEO). However, the power generating platform B is a utilitarian spacecraft or the like, and may be planet based or in low earth orbit, geosynchronous orbit, or it may be in a trajectory through space. It is the power generating platform B with which this invention is particularly concerned and which must be sustained by a continuous supply of power for performance, propulsion and/or maneuverability. And, it is a primary object of this invention to minimize battery storage of electrical energy by means for supplying energy during the inevitable eclipse periods in the planet (earth) shadow as is indicated by the arc 10. A feature of this invention is the positioning of at least one energy source platform A in orbit exposed to the sun and simultaneously with a laser beam 11 of wave energy beaming to the power generating platform B, thereby transmitting solar energy to the platform B. As shown in FIG. 1, the earth based platform A is suitably powered by any one of a number of conventional energy sources, such as hydroelectric power, fossil fuel or atomic energy. The energy source is converted by or at the energy source platform A into source energy that is then beamed to the power generating platform B to be consumed thereby for its operation. In practice, laser light is employed for energy transmission from platform A to platform B, and information waves of distinguishable frequencies are combined with and/or superimposed upon the energy waves of light for operational control of the platform B.

The onboard power requirements of a space craft or platform B are diverse, among which requirements is maneuverability and additionally herein for the major propulsion requirements. It is an object herein not only to minimize the battery load burden, but to provide energy at the platform B for its electric propulsion following the initial launch phase. Accordingly, the magnitude of rocket power required for launch is minimized with commensurate reduction in operational costs related to launch energy requirements.

Electric propulsion and its principles are well established for jet thruster means C, used after launch and in interplanetary trajectories, it being an object of this invention to employ electrical energy propulsion as a prime mover of the spacecraft and platform B. This art recognizes three general types of powered expellant acceleration devices; electrothermal, electrostatic and electrodynamic. The first mentioned electrothermal concept is considered to be the simplest, in which the enthalpy of the expellant is increased and converted into direct kinetic energy via a nozzle 12 (see FIG. 6). The propellant such as Hydrous Ammonia or preferably ablative Teflon© is electrically heated by passing it over and through a heating tube 13. The exhaust velocity is a function of temperature with considerably high efficiency. Electrical pulsing is employed to create a plasma that is augmented by evaporation of the expellant material exhausted through the nozzle. Accordingly, the jet thruster C is an effective propulsion device capable of prolonged thrust application for propelling the spacecraft and platform B, either into or in orbit, or in a trajectory.

Land based and airborne power beaming stations have been proposed, using laser light for short periods of time, to be assimilated by photovoltaic means at the satellite being powered. Great concern is made of beam-spread due to diffraction, and adaptive optical correction is then employed to reduce beam spread. However, it is feasible to illuminate solar arrays with power beaming during eclipse periods from remote power beaming stations. The purpose, of course, is to reduce the power system weight of the satellite, which is normally ⅕ of the total satellite mass. And, it has been estimated that the satellite mass can be reduced by 10%. Therefore, it is an object of this invention to provide laser light beaming means D for transmitting energy from an earth based energy source platform A or from an orbiting based energy platform A tracking the sun and converting solar energy into laser light energy transmitted to the power generating platform B and converted thereat to electric power by energy conversion means E1. The platforms A and B separate and simultaneously employ low energy infrared add high energy ultraviolet light for electrical power generation. Accordingly, each platform has energy conversion means E1 for insolation of infrared energy, and energy conversion means E2 for photovoltaic assimilation of ultraviolet energy.

The light beaming means D is a laser wave energy beaming means that intensifies and columnates light comprised principally of heat wave length light, in the low infrared range comprised of approximately 25% of the energy spectrum. The light beaming means D of the earth based energy source platform A includes means for producing concentrated heat energy infrared light for intensified columnated beaming along the laser beam 11 to the power generating platform B. Alternately, the light beaming means D of the orbit based energy source platform A includes means for direct conversion of solar energy into electrical power (by means of a heat engine—Stirling cycle) for producing concentrated heat energy bearing infrared light for intensified columnated beaming along the beam 11 to the power generating platform B. The power generating platform B is characterized by its alternate energy source, either the earth based hydro, fossil, or atomic source, or by the orbit or trajectory based solar source, and either of which is utilized for producing concentrated low energy infrared light waves that are transmitted by means of laser or, equivalent light wave to the power generating platform B for its in-house power, maneuverability and/or propulsion.

Figure 8:
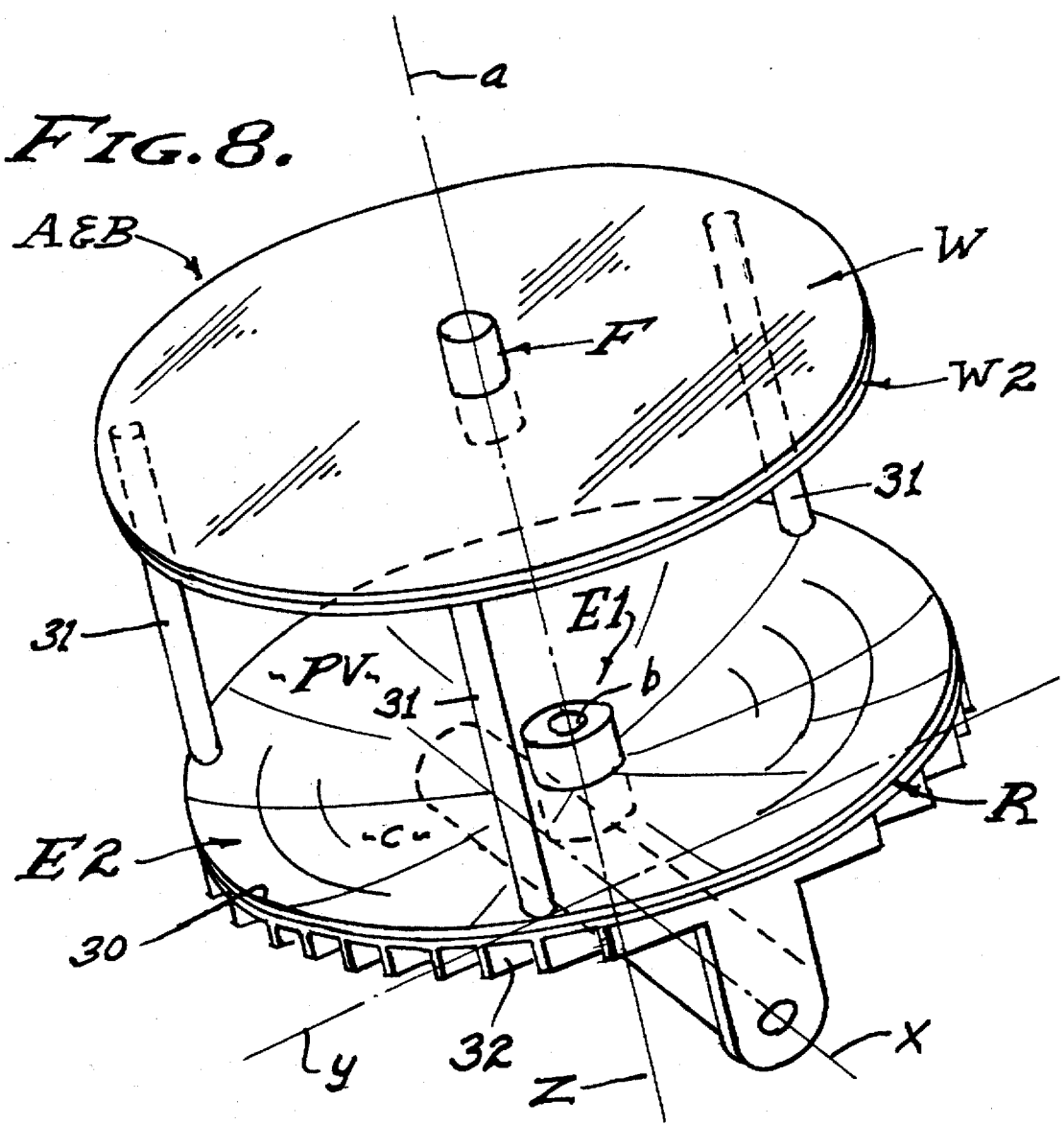
FIG. 8 is a perspective view of the holograph concentrator of the present invention as it is employed on both the power source platform and power generating platform, whereby high energy and low energy light are both absorbed.

Referring now to FIG. 8 of the drawings, this invention relates to insolation and microwave reception, as disclosed in my U.S. Pat. No. 4,490,981 entitled FIXED SOLAR CONCENTRATOR-COLLECTOR SATELLITE RECEIVER AND CO-GENERATOR issued Jan. 1, 1985, wherein the position of a microwave dish is essentially fixed and presents a "look angle" so as to have a "window" of view affording margin of tracking with a reception axis a at the elevation angle of the sun and within a microwave look angle. Holographic windows are provided to receive the changing altitude of sunlight and normalize its projection at selected wave lengths so as to emanate along and substantially parallel to the axis a of the apparatus. The planes of the holographic windows are angularly disposed with respect to the axis a aligned with the look angle, and recorded for infrared and ultraviolet light projection according to that angle.

It is an object of this invention to provide the energy source platform A with laser means D for beaming light wave energy to be tracked by the power generating platform B and converted into electrical power as by means of energy conversion means E1 and E2. The laser means D includes state of the art means for generating intensified infrared light for energy conversion by the means E1. In accordance with this invention, holography is employed in the tracking and light separation functions by both the energy source platform A and the power platform B, as will be described. Tracking and position perception is provided to produce images of three dimensional effect that have depth as related to the third dimension. State of the art positioning means such as robots involve three dimensional control and it is an object herein to employ the three dimensional effect of holography for motivating the three operational axes of any device as it may related in space to an object to be treated or in any way affected thereby.

White light is made up of many wave lengths and when passing through a holographic grid of the type herein described, it bends at many angles such that each wave length is bent at a different angle. Since holograms have both horizontal and vertical parallax, they offer varying three dimensional perspective when viewed from side to side or from top to bottom and vice versa. When providing white light as the illuminating source, and recognizing that each color is bent at a different angle and therefore if not optically altered prior to viewing, different perspectives arrive to the eye as a multi-colored "blur". It is a purpose of this invention to obtain two secondary holograms viewable and projected to a computer coupled viewing means illuminated in white light, namely, one which reduces vertical information and one which reduces horizontal information. For example and referring to FIG. 4 of the drawings, if a hologram of the overall object is masked by means of a horizontal slit 1 through which white sunlight or a white laser light source is employed to construct a secondary hologram at an image plane 2, it can be viewed side to side by a variety of light sources. The horizontal slit filters out the angles providing verticle information.

Figure 4:
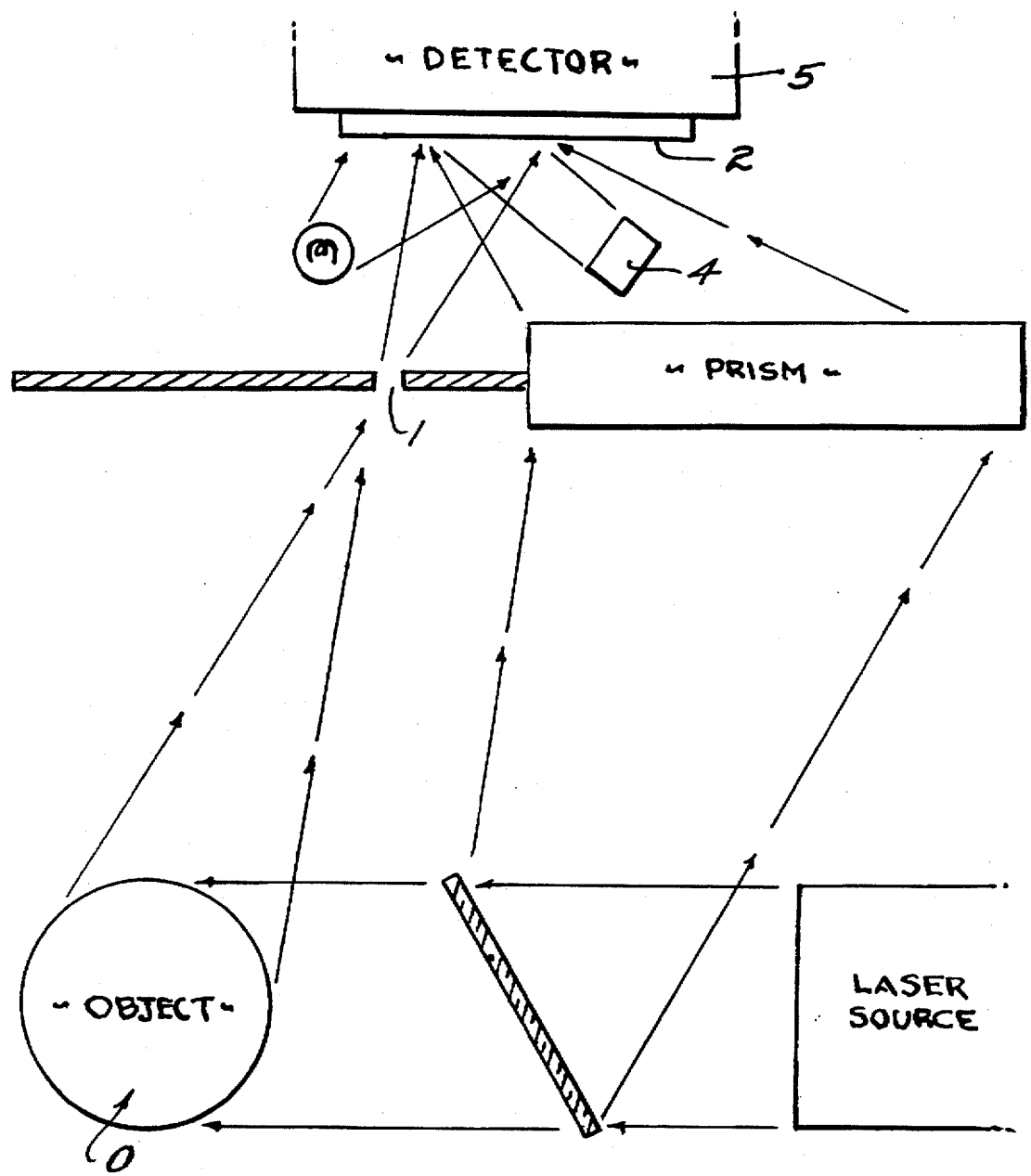
FIG. 4 is a schematic view illustrating the principles of holography.

If a duplicate hologram of the same overall object is masked by means of a vertical slit through which, the same laser source is employed to construct a secondary hologram at the image plane as shown in FIG. 4, it can also be viewed top to bottom by a variety of light sources with the vertical slit filtering out the angles providing horizontal information.

By viewing the laser illuminated portion of the overall object (the holographic grid serving only as the vertical memory of overall object information in two views) all reference angles are established for detector means (lens) 4 for independently converting their respective signals into electrical signal pulses, for example by positioning optical detectors 5 on x, y and z axes to position or seek out an object in space, shown herein as object O positioned in space and which is viewed through a lamination of holographic grids, its apparent position to the detector 5 becomes known.

Referring now to FIG. 5 of the drawings, three sensors 6, 7 and 8 on complementary axes x, y and z relate to apparent angular positions of the image as viewed through two sets of holographic grids as described above, and which accurately relate to the actual position of the object in space by the means described. The angular displacements for related servos on complementary servo axes x, y and z are then computed and directed through drive means to position the sensors 9 on said x, y and z axes, as may be required to coincide with the position in space of the aforementioned object O. It is to be understood that the state of the art techniques such as the use of laser lighting are employed, including the preparation of suitable holographic grids, or holograms, which create the depth perception required of the third dimension that is detected by this system.

Referring now to FIG. 8 of the drawings, the insolation and microwave receiver dish R as shown herein is installed on or in the power source platform A and involves generally, one or more and preferably two superimposed hologram windows W1 and W2 that redirect the passing light so that it is normalized and projected towards the infrared range and toward the ultraviolet range respectively, the heat absorbing energy converting means E1 at the vertex of infrared concentration, a plurality of photovoltaic energy converting and power generating cells PV at a collector plane surrounding the concentration of infrared light, the microwave dish R aligned with the window axis a and in the form of a substrate support carrying the photovoltaic cells PV, microwave feed means F on said axis and removed from the focus vertex of the focusing holographic window W1, and a finned condenser integral with the substrate support of the micro wave dish R and in circuit with the energy conversion means E1 when using a Rankine or Brayton cycle.

The first concentrating hologram window W1 focuses the light range of infrared onto a focal plane with concentration thereof spaced below said window and on the axis a. The window W1 is a planar element transparent to light and is disposed normal to the axis a of the unit apparatus. The window can be angularly disposed with respect to axis a and aligned with a light source elevation angle away from the satellite look angle of beam 11 (see FIG. 2). More particularly, the window W1 is a hologram comprised of a multiplicity of zone plate means as above described and recorded in a photosensitive film medium and fixed to concentrate and focus infrared light to a focal point b. It is to be understood that the focal point b can be off-axis, other than on the axis a; and that there can be a plurality of such focal points. In accordance with this invention, a plurality of holographic recordings are made within the medium layers of windows W1 for different positions of the light source and for each positions a hologram is recorded in the window W1 to concentrate the infrared range of light at the focal point b when the light source is positioned according to a time segment or position interval. Because of the sinuous nature of holographic gratings, the exposure of light focused at point b during each time position segment is gradual. That is, as the light source progresses from one time position segment to the next, the transmission of infrared light onto axis a at point b and focused at point b is gradually increased and decreased. Accordingly, the function of the holographic time position segment recordings are overlapped as required, so as to create a substantially uniform and continuous illumination at point b.

Figure 9:
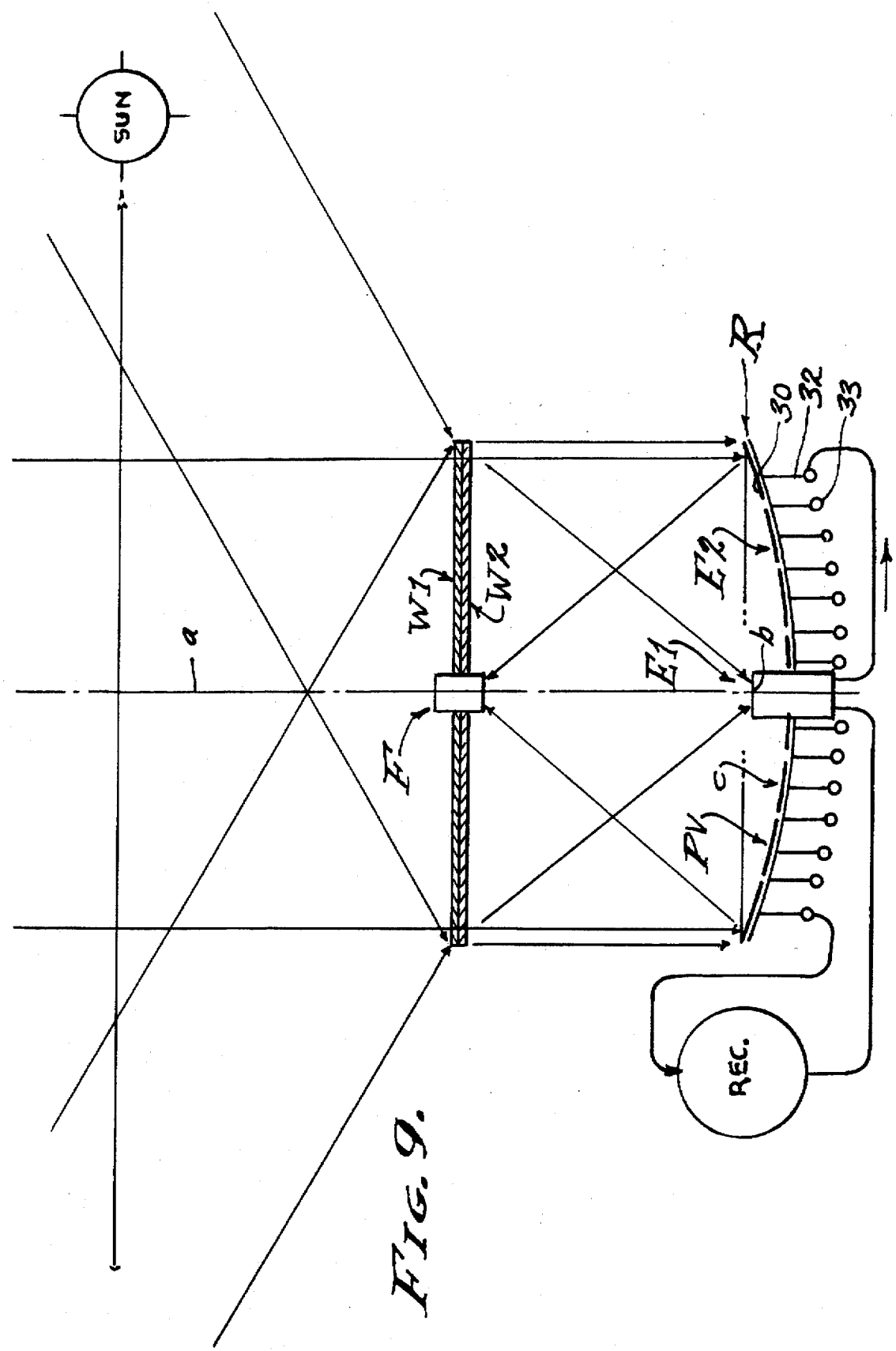
FIG. 9 is a diagrammatic view of the concentrator illustrating normalization of light onto the collector axis substantially coincidental with the look angle of the platform.

The second columnating hologram window W2 straightens the ultraviolet light range onto a concaved collecting plane c spaced below said window and centered on the axis a. As shown in FIG. 9, the plane c is at and surrounding the focal point b of window W1, and one window N1 superimposed upon the other window W2. The window W2 is a planar element transparent to light and is disposed normal to the axis a. Window W2 is angularly disposed with respect to axis c and is aligned with a light source angle away from the satellite look angle line 11. More particularly, the window W2 is a hologram comprised of a multiplicity of zone plate means as above described and recorded in a photosensitive film medium and fixed to columnate the ultraviolet light range onto the concaved collector plane c. In accordance with this invention, a plurality of holographic recordings are made within the medium layers of window W2 for different positions of the light source, and for each of which a holograph is recorded in the window W2 to columnate ultraviolet range light at the collector plane c when the sun or light source is at said predetermined position. Because of the sinuous nature of holographic gratings the exposure of light columnated onto plane c during each time position segment is gradual. That is, as the light source progresses from one time position to the next, the transmission of ultraviolet light onto plane c is gradually increased and decreased. Accordingly, the function of the holographic time position segments are overlapped as required, so as to create a substantially uniform and continuous illumination at plane c.

From the foregoing it will be understood that the white light is separated by holographic means into approximately 75% of high energy light in the ultraviolet range for photovoltaic energy conversion, and approximately 25% of low energy light in the infrared range for thermal energy conversion that is combined with said photovoltaic energy conversion for power transmission from the energy source platform A to the power generating platform.

In accordance with this invention, the windows W1 and W2 and the microwave dish R disposed on the axis a are carried by tracking means T for directing the look axis a generally toward the sun as clearly shown in FIG. 2 of the drawings. State of the art tracking means is employed to seek out the sun's position by rotatably positioning the look axis a on x, y and z axes as illustrated in FIG. 5 of the drawings. At least one rotational axis is employed. A feature of this invention is that given a general position of the look axis a with respect to the sun's location, the above described holographic windows W1 and W2 fine focus the light source image and separate the ultraviolet light and infrared light which are independently processed. The x, y and z axes are normally related rotational axes for omni positioning of the insolation elements of the platform A to assimilate a "spot" or "slit" of light for direct energy conversion into electrical power by heat engine means as next described.

Low energy insolation of infrared light (25%) is direct by means of energy conversion means E1 provided to absorb the heat of insolation at the focal point b of the window W1. A Stirling cycle energy conversion means E1 is preferred, comprised of a free piston Stirling-Linear-Alternator having a heated end at point b and characterized by a closed system with no intake or exhaust. Infrared heat is applied at point b, the operating cycle involving two isothermal processes, an expansion and a compression of a working fluid, linked by two constant volume processes performed by a regenerator. The effect of the regenerative process is to remove the difference of the internal energies of the working fluid corresponding to a temperature difference. Stored internal energy is then returned to the working fluid by a regenerating heating process following the isothermal compression. This type of Stirling engine is characterized by a piston displacer 22 in a common or differential diameter cylinder, there being various arrangements wherein a reciprocating member drives a field of an alternator means for generating electrical power, the armature being stationary without slip rings or commutation. State of the art Stirling engines of this type are employed herein for direct conversion of heat energy by insolation from the infrared light separated from the ultraviolet light by the holographic windows W1 hereinabove described.

The alternator means of the energy conversion means E1 generates alternating current (AC) that is combined with direct current (DC) generated by the photovoltaic energy conversion means E2 next described.

High energy assimilation of ultraviolet range light (75%) is directed by means of the photovoltaic energy conversion means E2 provided to absorb light energy at the collector plane c beneath the window W2 and surrounding the power generating energy conversion means E1 above described. The photovoltaic cells can vary in configuration and in construction and materials, according to the state of the art. However, those cells which are most responsive to the ultraviolet light range are employed herein and supported upon a substrate 30 chat forms the reflective surface of the microwave dish R, as will be described. In practice, there is a battery of photovoltaic cells PV arranged in parallel and/or in series as circumstances require in order to produce direct current voltage. As shown, there are direct current output lines 27 and 28 emanating from the battery of photovoltaic cells PV, protected by voltage regulator means 29, and delivering direct current (DC) voltage that is synchronously commutated as next described.

In accordance with this invention, the direct current output of the photovoltaic cells PV is synchronized by commutation-rectifier means K with the output of the conversion means E1 (AC) which is inherently synchronized with the external line power to which it is operationally responsive. It is to be understood that commutation can be either direct current (DC) from the energy conversion means E2 to alternating current (AC) compatible with the current generated by the energy conversion means E1, or it can be alternating current (AC) from the energy conversion means E1 to direct current (DC) compatible with the current generated by the energy conversion means E2. Accordingly, commutation-rectifier means K is provided for rectifying the electrical current of either means E1 or E2, so that the electrical power of one is compatible with the other. Thus, the most adaptable form of electric power is available for energy wave beaming from the power source platform A to the power generating platform B. Commutation-rectification can be by solid state means responsive to polarity changes in the current and such as to rectify the generated power as may be required.

In accordance with this invention, the microwave dish R underlies the battery of photovoltaic cells PV and forms the supporting substrate therefor. Accordingly, the dish R is concaved and of parabolic configuration with a reflective surface that focuses microwaves onto axis a between the collector plane and the planes of windows W1 and W2, and preferably at the planes of said windows. As shown, the microwave receiver means F for the reception of operational information to be processed by either platform A or B is disposed and supported within a central opening through said windows, and the windows are supported by struts or trusses 31 from the perimeter of the microwave dish R. The angular disposition of windows W1 and W2 to the axis a is according to any diversion between the light source altitude and the satellite look angle. The microwave receiver circuitry is not shown, and is installed according to the state of art.

In accordance with this invention, the substrate support for the photovoltaic cells is a heat absorptive reflective surface that protects the PV cells from overheating, and simultaneously functions in combination,with a Rankine or Brayton cycle as the means E1. As shown, the structural shape of the parabolic dish R is maintained by means of deep heat radiating ribs or fins 32 that depend from the lower face of the dish R and through which working fluid coils 33 extend for the exchange of heat. The coils 33 are embedded or attached to the ribs 32 remote from the substrate 20 so that heat does not adversely affect the PV cells.

For the purpose of this invention the energy source platform A (or platforms A) is the control source that converts the solar light, both infrared and ultraviolet, into heat energy laser light for subsequent insolation and conversion into electric power by the power generating platform B next to be described. And, a feature of this invention is its system of platforms A and B in that there is always an energy source and controlling platform A tracking at least one power generating platform B. Accordingly and in addition to power beaming by the platform or platforms A, said controlling platform A also beams microwave signals by command means M1 for directing the activity of said platform B. Therefore, the power generating platform B, like the energy platform A, includes the windows W1 and W2, and also the energy conversion means E1, all as hereinabove described with reference to the platform A. In its preferred form, the controlled platform B is distinct in that it includes receiver means F for reception of signals from the aforesaid command satellite and preferably a microwave receiver means.

Like the energy source platform A, the power generating platform B includes the windows W1 and W2 and the microwave dish R disposed on the axis a and carried by tracking means T for directing the look axis a generally toward the energy source platform A as clearly shown in FIG. 2 of the drawings. State of the art tracking means is employed to seek out the position of platform A by rotatably positioning the look axis a on x, y and z axes. The above described holographic windows W1 and W2 fine focus the platform A's image and separate the infrared light which is independently processed. The x, y and z axes are normally related rotational axes for omni positioning of the insolation elements of the platform B to assimilate a "spot" of power beamed laser light for direct energy conversion into electrical power by the heat energy conversion means E1 as hereinabove described and provided to absorb the heat of insolation at the focal point b of the window W1. Again, a Stirling cycle energy conversion means E1 is preferred, comprised of a free piston Stirling-Linear-Alternator having a heated end at point b and characterized by a closed system with no intake or exhaust, all as hereinabove described, for direct conversion of power beamed heat energy by insolation from the infrared light separated from the microwave command signal transmission of means M1, by the holographic windows W1 hereinabove described. As shown, the alternator means of the energy conversion means E1 at the power generating platform B generates alternating current (AC) that is used for in-house operation, maneuvering and for primary propulsion. Alternately, high energy ultraviolet light can be power beamed, with conversion by means E2 at the platform B, all as hereinabove described.

As in the energy source platform A, the microwave dish R of the power generating platform B underlies the windows W1 and W2, and the dish R is concaved and of parabolic configuration with a reflective surface that focuses microwaves onto axis a between the collector plane and the planes of windows W1 and W2, and preferably at the planes of said windows. As shown, the microwave receiver means F for the reception of operational signals from platform A is disposed within the central opening through said windows of platform B, and the windows are supported by the struts or trusses 31 from the perimeter of the microwave dish R. The microwave receiver circuitry is not shown, and is installed according to the state of the art.

Figure 10:
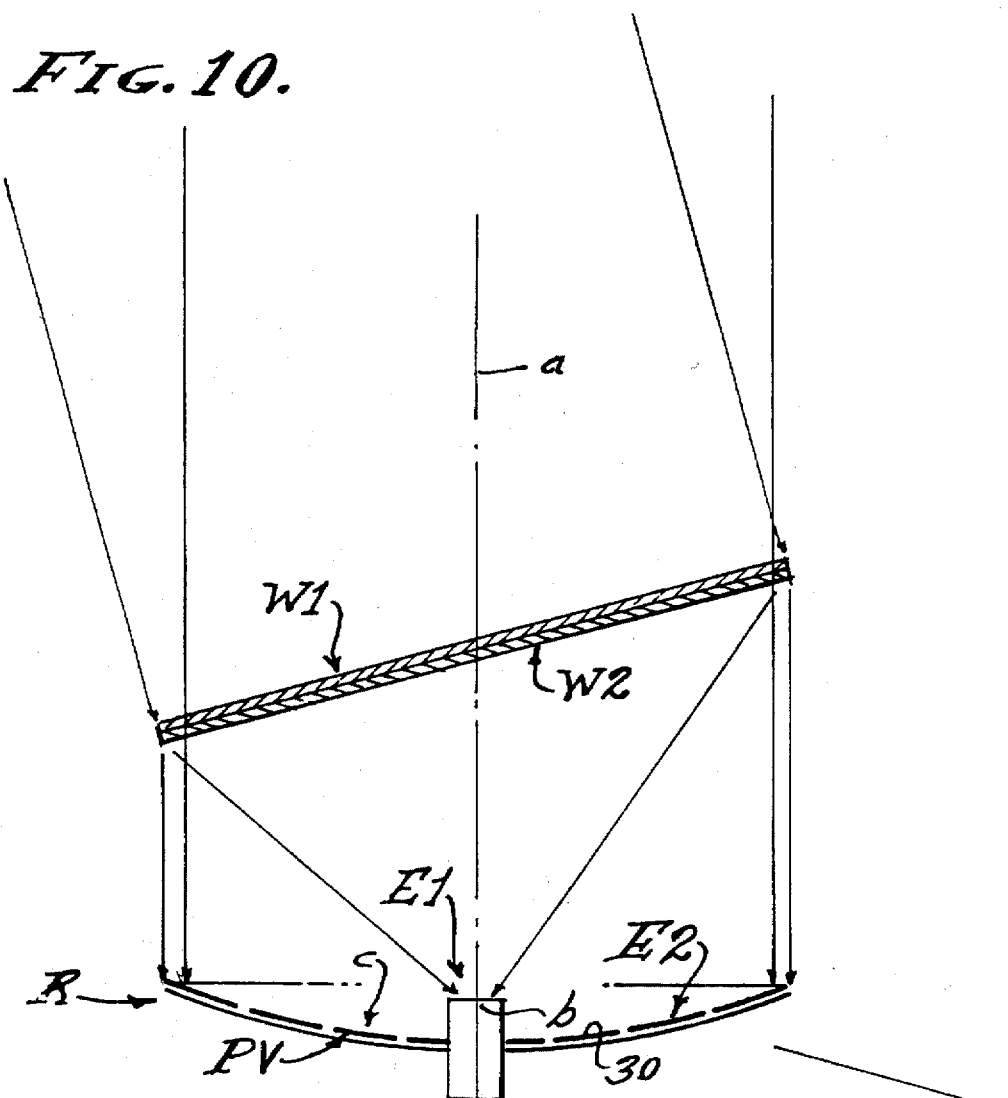
FIG. 10 is a view similar to FIG. 9 illustrating a condition wherein the elevation angle of the collector is angularly disposed to the look angle thereof.

Referring now to FIG. 10 and 11 of the drawings, a holographic embodiment of solar and/or power beaming tracking and light energy insolation is employed, similar to that disclosed in my U.S. Pat. Nos. 4,377,154 issued Mar. 22, 1983 and 4,382,434 issued May. 10, 1983. These two patents relate to Prismatic Tracking Insolation Collectors that are characterized by elongated prisms of acute apex angle maintained with an objective face disposed normal to the sun (or beamed) rays and through which dispersed light is projected from a transmission face and onto a coordinated mirror for geometrical focus onto a target, the heat rays of the spectrum being concentrated onto the target by lens means on the plane of said projection, an astrotimer revolving the prisms and mirrors throughout reversed morning and afternoon modes in alignment with the traverse plane of the sun (or power beaming platform).

Referring now to the present disclosure and to FIGS. 10 and 11 of the drawings, infrared insolation and ultraviolet assimilation is by holographic means that turns the light by as much as 90°, and is characterized by elongated holograms angularly disposed to receive the sun (or beamed) rays and through which separated wave lengths of light are projected to the energy conversion means E1 and E2 of elongated form or configuration (see FIG. 11). The means E1 is comprised of an elongated heater head 24 and focal point b, as produced by a prism lens system, to dramatically increase the insolation-assimilation area and for collecting or for beaming a "bar" of light as distinguished from a "spot" of light. The means E2 is comprised of an elongated semi-cylindrical or parabolic surface (mirror) or photovoltaic PV substrate for collecting or for beaming a "bar" of light as distinguished from a "spot" of light. The embodiment shown in FIGS. 10 and 11 is one for collecting and converting wave energy, however it is to be understood that the insolation and power assimilation elements can be replaced with state of the art wave energy beaming elements (not shown). Whether collecting or beaming, a slit or bar of light is involved in the transmission of energy.

The recorded holographic windows W1 and W2 seek out the sunlight energy source or laser beaming source, the distinct feature being holographic line focus, rather than "spot" beaming or "point focus", which enables the area of beamed light to be greatly augmented, and not confined to the limited diameter of a circular lens system. As disclosed, low energy infrared and high energy ultraviolet lights are separated and independently processed, one for heat insolation and the other for photovoltaic power generation.

Having described only the typical preferred forms and application of my invention, I do not wish to be limited or restricted to the specific details herein set forth, but wish to reserve to myself any modifications or variations that may appear to those skilled in the art, as set forth within the limits of the following claims.

I claim:

1. A wave energy beaming-tracking and holocentrator light transmission system for powering a space vehicle in earth orbit and including;

at least one power source platform in earth orbit and having insolation means exposed along a reception axis to the sun for converting solar energy into wave form and means for the concentration of and the beaming of the same as collimated light wave energy, a power generating platform in and in earth orbit with said space vehicle and including a light source concentration means having a holographic window means comprised of a first holographic window means for concentrating low infrared range light onto the heat absorbing means for receiving and concentrating said light wave energy and for the generation of electrical power, and a second holographic window means for collimating high ultraviolet range light onto a photovoltaic electrical power means and comprised of a transparent medium having a thickness accommodating a multiplicity of zone plate means and each provided therein for the reception of and the passage of said light wave energy and for the concentration thereof, tracking means for positioning the power source platform insolation means reception axis within a look angle of the sun, and tracking means for positioning the power source platform means for beaming said wave energy within a look angle of reception by the holographic window means of the power generating platform;

the vehicle power generating platform having a light energy conversion means for receiving said concentration of light wave energy from the multiplicity of zone plates within said look angle and for the generation of electrical power to operate the space vehicle;

wherein the power source platform means for converting energy and the power generating means for the reception of said wave energy are of rectilinear configuration for transmission of an elongated bar of light wave energy.

2. The energy beaming-tracking system for powering a space vehicle as set forth in claim 1, wherein the space vehicle and power generator platform are in a low earth orbit.

3. The energy beaming-tracking system for powering a space vehicle as set forth in claim 1, wherein the space vehicle and power generator platform are in a geosynchronous earth orbit.

4. The energy beaming-tracking system for powering a space vehicle as set forth in claim 1, wherein the at least one power source platform and insolation means for converting solar energy into wave form are in a low orbit.

5. The energy beaming-tracking system for powering a space vehicle as set forth in claim 1, wherein the at least one power source platform and insolation means for converting solar energy into wave form are in a geosynchronous earth orbit.

6. The energy beaming-tracking system for powering a space vehicle as set forth in claim 1, wherein the heat absorbing electrical generator means and the photovoltaic electrical power means are connected by commutation means for powering the space vehicle.

* * * * *

UNITED STATES PATENT AND TRADEMARK OFFICE
CERTIFICATE OF CORRECTION

PATENT NO. : 5,685,505

DATED : November 11, 1997

INVENTOR(S) : Milton Meckler

It is certified that error appears in the above-identified patent and that said Letters Patent is hereby corrected as shown below:

Title page item [57],
In the Abstract of The Disclosure - line 6, change "columnate" to --collimate--.

Claim 1, line 1, change "holocentrator" to --holoconcentrator--.

Column 5, line 9, change "columnated" to --collimated--.

Column 6, line 6, change "columnated" to --collimated--;

line 18, change "columinating" to --collimating--.

Column 11, line 23, change "columnating" to --collimating--.

Column 12, line 48, change "chat" to --that--.

Signed and Sealed this

Twenty-sixth Day of May, 1998

Attest:

BRUCE LEHMAN

*Attesting Officer*      *Commissioner of Patents and Trademarks*